United States Patent [19]

Paterson et al.

[11] Patent Number: 4,924,437

[45] Date of Patent: May 8, 1990

[54] ERASABLE PROGRAMMABLE MEMORY INCLUDING BURIED DIFFUSION SOURCE/DRAIN LINES AND ERASE LINES

[75] Inventors: James L. Paterson, Richardson; David D. Wilmoth, Sugarland; Bert R. Riemenschneider, Murphy, all of Tex.

[73] Assignee: Texas Instruments Incorporated, Dallas, Tex.

[21] Appl. No.: 130,774

[22] Filed: Dec. 9, 1987

[51] Int. Cl.⁵ .............................................. G11C 11/40
[52] U.S. Cl. ...................................... 365/185; 365/218; 357/23.5; 437/43
[58] Field of Search ............... 365/182, 184, 185, 218, 365/104; 357/23.5; 437/43

[56] References Cited

U.S. PATENT DOCUMENTS

| | | | |
|---|---|---|---|
| 4,405,995 | 9/1983 | Shirai et al. | 365/218 |
| 4,453,234 | 6/1984 | Uchida | 365/185 |
| 4,531,203 | 7/1985 | Masuoka et al. | 365/185 |
| 4,561,004 | 12/1985 | Kuo et al. | 365/185 |
| 4,750,024 | 6/1988 | Schreck | 357/41 |

FOREIGN PATENT DOCUMENTS

| | | | |
|---|---|---|---|
| 0203697 | 11/1983 | Japan | 365/104 |
| 0045067 | 3/1985 | Japan | 357/23.5 |

OTHER PUBLICATIONS

Masuoka et al., "A 256K Flash EEPROM using Triple Polysilicon Technology", IEEE ISSCC, Feb. 14, 1985, Dig. of Tech. Papers, pp. 168–169, 335.

Primary Examiner—Stuart N. Hecker
Assistant Examiner—Glenn A. Gossage
Attorney, Agent, or Firm—Larry C. Schroeder; Rodney M. Anderson; Melvin Sharp

[57] ABSTRACT

An EEPROM cell and array of cells is disclosed having buried diffusion source/drain lines and buried diffusion erase lines. The cells further include coupling between the floating gate and control gate above the source/drain diffusion. The disclosed cell allows high packing density and operation at low voltages.

5 Claims, 8 Drawing Sheets

ERASABLE PROGRAMMABLE MEMORY INCLUDING BURIED DIFFUSION SOURCE/DRAIN LINES AND ERASE LINES

CROSS-REFERENCE TO RELATED APPLICATIONS

Copending U.S. application Ser. Nos. 06/785,309, filed Sept. 23, 1985, now U.S. Pat. No. 4,742,492, and Ser. No. 07/065,699, which is a continuation of Ser. No. 06/780,851, filed Sept. 27, 1985, now abandoned disclose related subject matter. All of these cross-referenced applications are assigned to the assigne of the present application.

BACKGROUND OF THE INVENTION

1. Field of the Invention

The present invention relates to electronic semiconductor devices, and, more particularly, to erasable programmable memory devices and methods of fabrication.

2. Description of the Related Art

Nonvolatile semiconductor memory devices based on metal-oxide-semiconductor field effect transistors (MOSFETs) were first proposed in 1967 (see Sze, Physics of Semiconductor Devices, pp. 496–506 (Wiley-Interscience 2d Ed 1981)). These devices store a bit of information as the presence or absence of a quantity of electrical charge on a floating gate that is located so that the charge affects the threshold voltage of a MOSFET. Currently, MOSFET nonvolatile memory devices include EPROMs, EEPROMs, and Flash EEPROMs. EPROM (erasable programmable read only memories) cells store a bit of information as a quantity of electrons on a floating gate; the electrons are avalanche injected into the floating gate from the drain-end of the cell transistor channel and are erased for all cells simultaneously by photoemission under ultraviolet irradiation. The Floating gate Avalanche injection MOS transistor is typically called a "FAMOS" transistor. The density of EPROMs had reached 1 megabit by 1984, but the inconvenience of the ultraviolet erase has led to the development of EEPROMs and Flash EEPROMs.

EEPROMs (electrically erasable programmable read only memories) both program and erase information for a single memory cell by tunneling charges through insulators: the FLOTOX version uses a floating gate as with an EPROM but with a thin tunneling oxide between the floating gate and the transistor drain; the textured poly version uses tunneling between three polysilicon gates with one of the gates a floating gate; and the MNOS version uses a stacked oxide and nitride gate insulators and stores charges in traps in the nitride and programs and erases by tunneling through the oxide to the channel region. See generally S.Lai et al, "Comparison and Trends in Today's Dominant $E^2$ Technologies." Digest of Technical Papers. pp. 580–583 1986 IEDM.

Flash EEPROMs are hybrids that program in the manner of either EPROMs (avalanche injection) or EEPROMs (tunneling) and erase in the manner of EEPROMs (tunneling) but with the erasure generally limited to bulk electrical erasure of the entire memory analogous to the ultraviolet light erasure of an EPROM.

The trend to larger scale integration has demanded small, highly packed memory cells with low power dissipation, and the desire for flexibility of multiple reprogramming has demanded durable tunneling oxides. Consequently, many variations of the basic EPROM, EEPROM, and Flash EEPROM cells have been introduced. For example, McElroy, U.S. Pat. No. 4,373,248 shows EPROM cells in an array with a set of parallel continuous buried n+ diffusion lines in a silicon substrate acting as sources and drains (bitlines) for the floating gate cells with a second set of parallel continuous polysilicon lines over the floating gates acting as control gates (wordlines); the polysilicon lines are perpendicular to the buried diffusion lines. J. Esquivel et al, High Density Contactless, Self Aligned EPROM Cell Array Technology, 1986 IEDM Digest of Technical Papers, pp. 592–595, Mitchell, U.S. Pat. No. 4,597,060, and Sugiura et al, U.S. Pat. No. 4,451,904 also have buried bitlines and perpendicular polysilicon wordlines in an EPROM array.

Miyamoto, U.S. Pat. No. 4,642,673 has a floating gate EEPROM cell array with parallel continuous buried diffusion lines acting as control gates and each cell has a floating gate transistor plus a select transistor in series with the floating gate extending over a diffusion line; the source/drain contacts are to metal lines (bitlines and source lines) perpendicular to the diffusion lines, and gates for the select transistors are polysilicon lines (wordlines) parallel to the diffusion lines. Note that the series select transistor is added to avoid the case of an over-erased floating gate transistor going into depletion mode and conducting even with no voltage applied to the control gate.

D. Guterman, U.S. Pat. No. 4,590,504 has an EEPROM array with each cell having a buried source region connected to a buried ground line and a buried drain region including a remote drain portion for tunneling into the floating gate connected to a metal bitline plus parallel polysilicon control gate line and select transistor gate line.

F. Masuoka et al, A 256K Flash EEPROM Using Triple Polysilicon Technology, 1985 ISSCC Digest of Technical Papers, pp. 168–169, has a Flash EEPROM cell array with first level polysilicon erase lines, second level polysilicon floating gates, and third level control gate lines (wordlines); the floating gate transistor and the select transistor are merged by having the floating gate over only a portion of the channel region. The transistor source connects to a diffusion line and the drain connects to a metal line over the polysilicon lines; the diffusion lines and the wordlines are parallel, and the erase lines and the metal lines are parallel and are perpendicular to the diffusion lines and wordlines. The floating gate is programmed by avalanche injection as in an EPROM, and erasure of the floating gate is by tunneling to the adjacent erase line.

However, the known EEPROMs and Flash EEPROMs have problems of large cell size limiting packing density, isolation and programmability for dense arrays of cells and complex processing.

SUMMARY OF THE INVENTION

The present invention provides small, highly packed EEPROM and Flash EEPROM cell arrays with buried source, drain, and erase lines for a planar topography without metal lines, sub-photolithographic source and drain dimensions for high packing density, remote erase nodes, and minimal area double-level polysilicon cell and array with a merged pass gate and electrical write and erase from first level polysilicon to underlying diffusion.

This solves the problems of the known cells and arrays of large area and complicated processes.

BRIEF DESCRIPTION OF THE DRAWINGS

The drawings are schematic for clarity.

DESCRIPTION OF THE PREFERRED EMBODIMENTS

Figure 1:
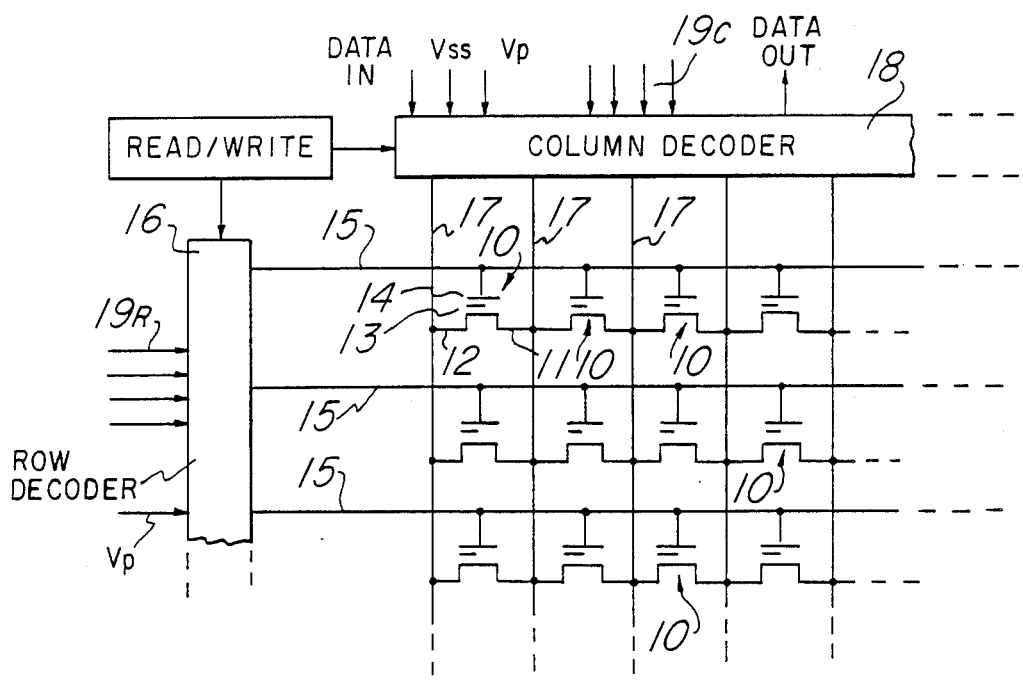
FIG. 1 is a plan view of a portion of a first preferred embodiment EEPROM.

FIG. 1 is a schematic plan view of a first preferred embodiment EEPROM illustrating a portion of the array of memory cells and peripheral devices; the full array may have over a million cells and be fabricated on a silicon substrate of size about 60 square millimeters. Each cell is a floating gate n channel MOSFET 10 having a source 11, a drain 12, a floating gate 13, and a control gate 14. A bit of information is stored in cell 10 by net charge on floating gate 13: with no net charge or a net positive charge on floating gate 13, the threshold voltage for cell 10 is low, and with a substantial net negative charge on floating gate 13, the threshold voltage is high. The threshold voltage of cell 10 is determined to be high or low simply by applying a control gate voltage (which is between the high and low threshold voltages) and sensing the transistor channel impedance. The erased state for a cell is taken to be the state with a high threshold voltage (substantial net negative charge on floating gate 13), and the programmed state is taken to be the state with a low threshold voltage.

All of the gates 14 in a row of cells are connected to a row address line (wordline) 15, and all of the wordlines 15 are connected to a row decoder 16. All of the source and drain electrodes 11 or 12 in a column of cells are connected to a column line (bitline) 17, and the source and drain bitlines 17 are connected to a column decoder 18. The operation of the first preferred embodiment will be considered in detail in connection with the description of the individual cells infra; however, the following cursory description of the operation provides a convenient overview. To read a selected cell, column decoder 18 applies about +3 volts to the bitline 17 connected to drain 12 of the selected cell and 0 volts to all other bitlines 17, and row decoder 16 applies about +5 volts to the wordline 15 connected to control gate 14 of the selected cell and about 0 volts to all other wordlines 15; thus all cells except the selected cell are turned off regardless of any net charges on their floating gates and the selected cell is turned on or off depending upon the net charge on floating gate 13. Thus the impedance seen by column decoder 18 between the bitline 17 connected to the source of the selected cell and the bitline 17 connected to the drain of the selected cell indicates the bit of information stored by the selected cell. Signals on input lines 19C determine the bitline 17 selection and signals on input lines 19R determine the wordline 15 selection.

In the block erase mode, column decoder 18 applies a voltage of about 0 volts to all bitlines 17. To erase the row of cells or block of cells which includes cell 10, row decoder 16 applies a voltage pulse of about +13 volts to the wordline 15 connected to control gate 14 of the selected row and about 0 volts to all other wordlines 15. This causes tunneling of electrons from drain 12 into floating gate 13 for each cell in the row and results in a block erase. Of course, all rows can be simultaneously erased by applying the voltage pulse to all wordlines and this yields a bulk erase. In the program mode, column decoder 18 applies a voltage of about +5 volts to the bitline 17 connected to the drain of the selected cell and about 0 volts to all other bitlines 17. To perform the programming, row decoder 16 applies a voltage pulse of about −8 volts to the wordline 15 connected to the control gate 14 of the selected cell and about 0 volts to all other wordlines 15. Electrons tunnel out of floating gate 13 into drain 12 for the selected cell.

Figure 2A:
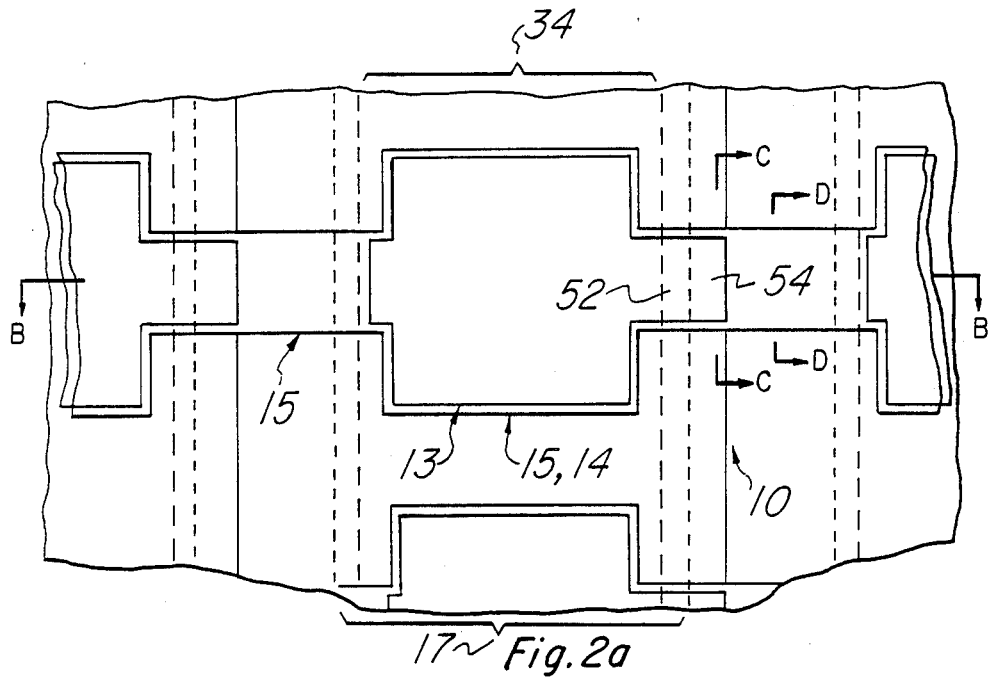
FIGS. 2A-D are plan and cross sectional elevation views of a first preferred embodiment cell.
Figure 2B:
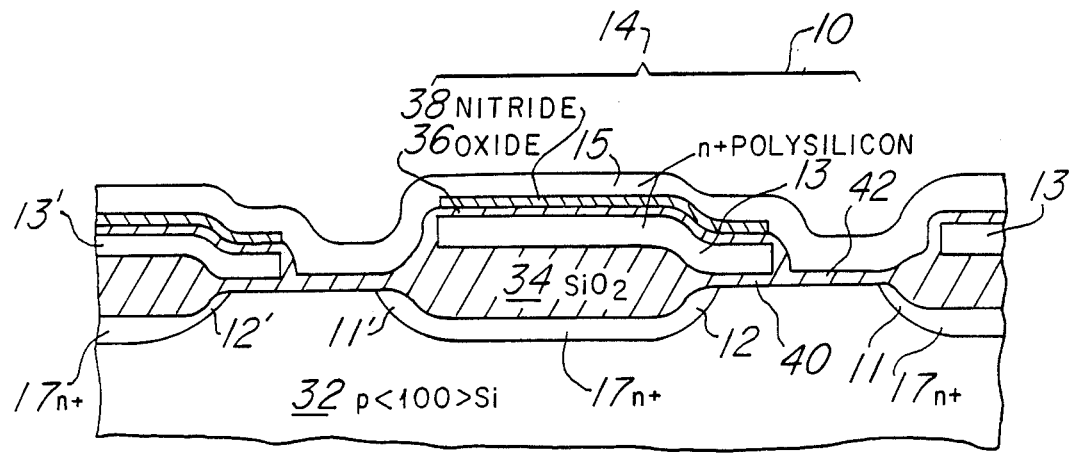
Figure 2C:
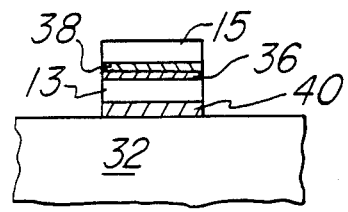
Figure 2D:
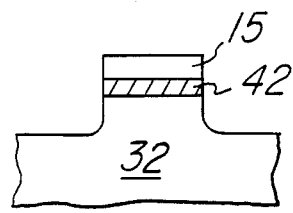
Figure 3A:
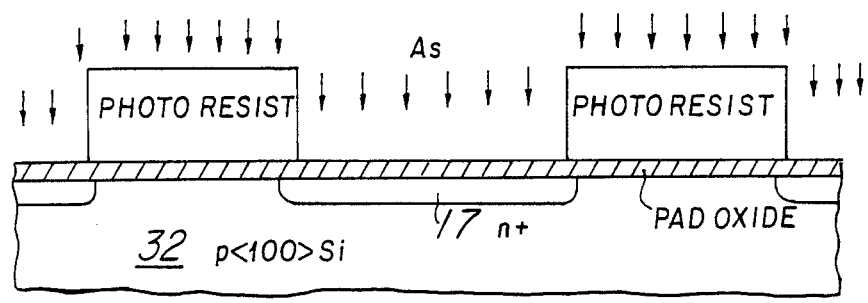
FIGS. 3A-F illustrate a first preferred embodiment method of fabrication of the first preferred embodiment cell.
Figure 3B:
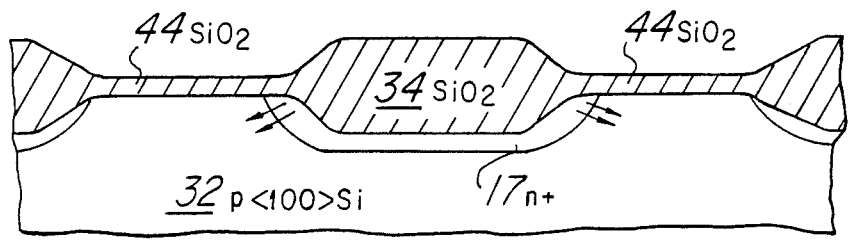
Figure 3C:
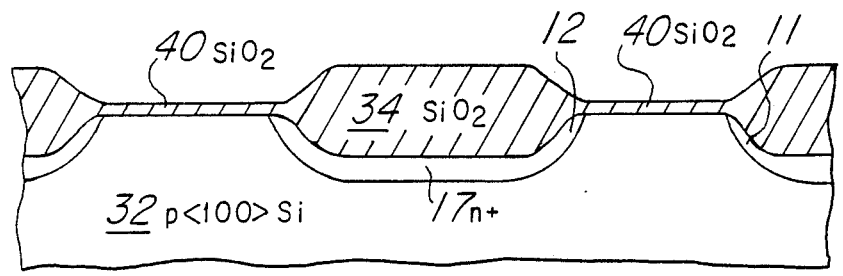
Figure 3D:
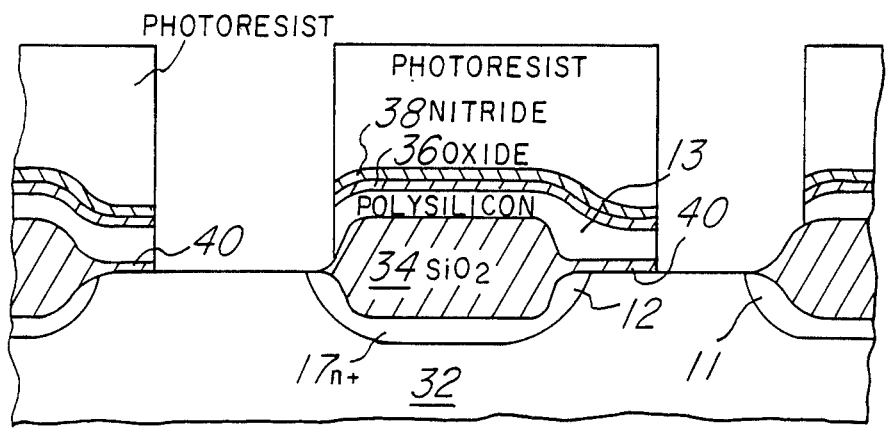
Figure 3E:
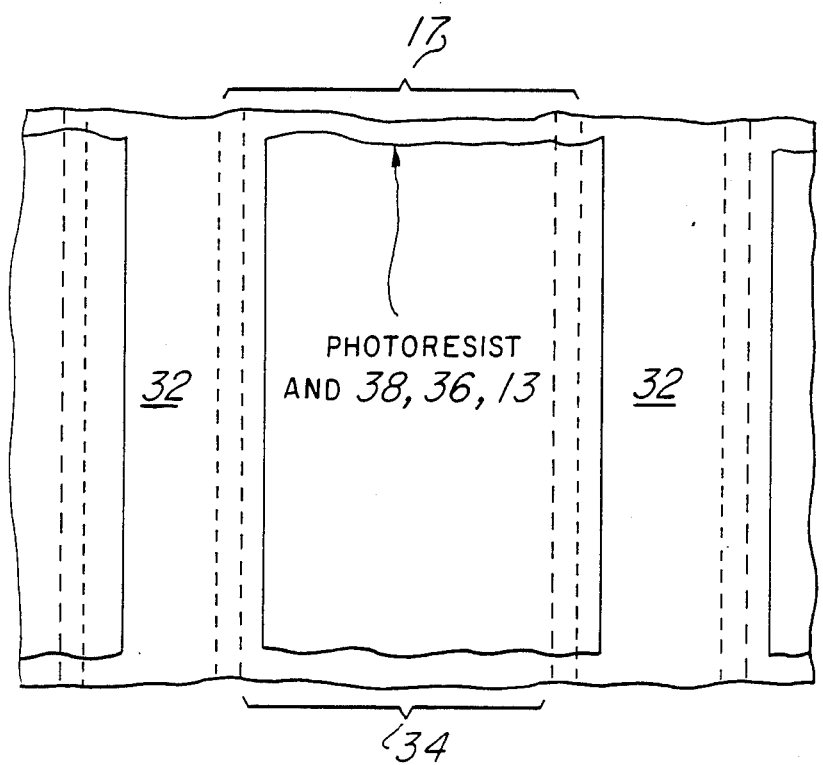
Figure 3F:
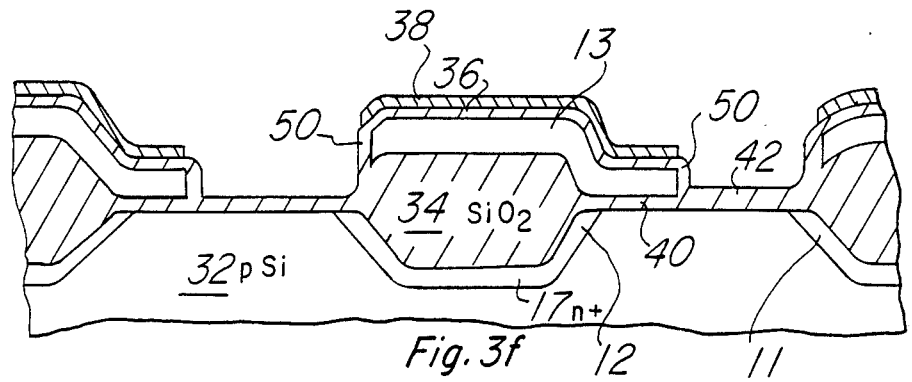

FIGS. 2A-D are schematic plan and cross sectional elevation views of an individual cell, generally denoted 10, in the first preferred embodiment; passivation, contacts, interconnections, metallizations, and packaging have been omitted for clarity. Cell 10 includes p type <100> oriented silicon substrate 32, buried n+ bitlines 17 which provide source 11 and drain 12, field oxide (silicon dioxide) 34, n+ doped polysilicon (polycrystalline silicon) floating gate 13, interlevel oxide 36, interlevel nitride (silicon nitride) 38, n+ doped polysilicon wordline 15 which provides control gate 14 as indicated in FIG. 2B, first gate oxide 40, and second gate oxide 42. As is apparent from FIG. 2A, cell 10 is a cross-point cell (the cell is at the cross-point of a bitline and a wordline) and has the following dimensions expressed in terms of a scalable length $\lambda$: The channel region between source 11 and drain 12 has width $\lambda$ and length $2\lambda$, buried bitlines have width $3\lambda$, floating gate 13 has width (vertical distance in FIG. 2A) $3\lambda$ and is separated from the adjacent floating gate by $\lambda$, the widest portion of floating gate 13 has length $2\lambda$, the area 52 of the overlap of floating gate 13 on drain region 12 is about $\frac{1}{3}\lambda^2$, the area 54 of the overlap of floating gate 13 on the channel region is also about $\frac{1}{3}\lambda^2$, and the total area of floating gate 13 is about $7\lambda^2$. Thus cell 10 occupies about $20\lambda^2$. Typically, $\lambda$ would equal about 1 $\mu$m for a 1 Megabit EEPROM, and the oxide and nitride thicknesses described infra are convenient for such $\lambda$.

given under the presumption of oxide and nitride thicknesses of 100 Å for first gate oxide 40 and 200 Å for both interlevel oxide 36 and nitride 38 and 400 Å for second gate oxide 42. The region between source 11 and drain 12 comprises a merged transistor with control gate 14 over floating gate 13 on first gate oxide 40 forming a floating gate transistor and with control gate 14 on second gate oxide 42 forming a select transistor in series with the floating gate transistor. The transistors have their threshold voltage (with no net charge on floating gate 13) adjusted to about 0.75 volt. Information in cell 10 is stored in terms of whether the merged transistor is turned on by a control gate voltage of 5 volts; the applied drain voltage is 3 volts. If floating gate 13 has a negative net charge sufficient to raise the threshold of the floating gate transistor to above 5 volts, then a control gate voltage of 5 volts is insufficient to turn on the merged transistor; whereas, if floating gate 13 has minimal net charge then a control gate voltage of 5 volts turns on both transistors. Contrarily, if the control gate voltage is about 0 volts, then the select transistor is off; this compensates for any over programming of the floating gate transistor which could lower the threshold voltage to below 0 (depletion mode).

Cell 10 is erased (put negative net charge on floating gate 13) by tunneling electrons from drain 12 into floating gate 13 under the conditions of +13 volts on wordline 15 which includes control gate 14, 0 volts on all other wordlines or wordline segments, 0 volts on bitline 17 which includes drain 12, and +5 volts on all other bitlines. The tunneling is driven by the initial potential drop of about −10 volts across the thin oxide (100 Å at the drain edge) from drain 12 to floating gate 13. Other cells in the same row are not erased because the +5 volts on all other bitlines implies the potential drop from drain to floating gate is only about −5 volts for such cells; and all other cells in different rows are not programmed because the control gate voltage is 0 volts.

Cell 10 is programmed (reduce net charge on floating gate 13 to minimal levels) by tunneling electrons from floating gate 13 to drain 12 under the conditions −8 volts on wordline 15 which includes control gate 14, 0 volts on all other wordlines, +5 volts on bitline 17 which includes drain 12, and 0 volts on all other bitlines. Again the tunneling is driven by the initial potential drop of about +10 volts across the thin oxide from drain 12 to floating gate 13. Other cells in the same row are not programmed because the 0 volts on all other bitlines implies the potential drop from drain to floating gate is only about +5 volts for such cells; and all other cells in different rows are not programmed because the control gate voltage is 0 volts.

The voltages required for programming and erasing cell 10 depend upon the relative capacitive couplings and the applied biases. Floating gate 13 is an equipotential, and the capacitive coupling between floating gate 13 and another element of cell 10 may be approximated by their area of overlap divided by the distance of separation and multiplied by the permittivity of the separation material. The capacitances involving floating gate 13 are:

| Paired element | Overlap area ($\lambda^2$) | Effective separation | Relative capacitance |
| --- | --- | --- | --- |
| Drain 12 | 0.33 | 100 Å | 1 |
| Substrate 32 | 0.33 | 100 Å | 1 |
| Control gate 14 | 7 | 300 Å | 7 |
| Bitline 17 | 6.33 | 4,000 Å | 0.47 | where the floating gate 13/bitline 17 capacitance is for the portion of bitline 17 under oxide 34 and the floating gate 13/drain 12 capacitance is for the drain 12 portion of bitline 17 under first gate oxide 40. The potential, $V_0$, of floating gate 13 under a set of biases on the other four elements is simply derived from $$C_0 V_0 = Q_{net} + C_{FD} V_D + C_{FS} V_S + C_{FC} V_C + C_{FB} V_B.$$

which expresses the net charge $Q_{net}$ on floating gate 13 in terms of the capacitances between floating gate 13 and each of the other four elements and the potentials of each of the other four elements plus the total capacitance ($C_0$) and the potential ($V_0$) for floating gate 13. Of course, $Q_{net}$ and $V_0$ vary with time during programming and erasing, and a solution taking into account time variance would include integrating the Fowler-Nordheim tunneling current over time with the tunneling current depending upon $V_0-V_D$. The ratio of $C_{FC}$ to $C_{FD}$ is about 7, and this implies that about 85% of the potential difference between control gate 14 and drain 12 appears across first gate oxide 40. Thus only 13 volts between control gate 14 and drain 12 are needed to have about 10 volts across first gate oxide 40 for efficient tunneling because this represents and electric field of about 10 MV/cm for the 100 Å thick first gate oxide 40. The location of floating gate 13 and control gate 14 over oxide 34 provides large overlap area within a compact cross point design for cell 10; and the formation of drain 12 by diffusion of dopants during formation of oxide 34 yields a small overlap area of the drain 12 to floating gate 13 (the length of drain 12 is sub-photolithographic). These factors provide the large ratio of capacitive couplings which permits low voltages to be used for programming and erasing. Note that the area of cell 10 could be reduced to $5\lambda \times 3\lambda = 15 \lambda^2$ by eliminating the lateral (vertical in FIG. 2A) bulge in the polysilicon, but this would lessen the capacitive coupling ratio and require increased voltages for programming and erasing.

During erasing of cell 10 control gate 14 is at about 13 volts and drain 12 at about 0 volts. However, bitline 17 which includes drain 12 also includes source 11′ of the adjacent merged transistor in the same row using the same wordline 15 (see FIG. 2B). If drain 12′ of the adjacent merged transistor is biased at about 5 volts, current will flow in the adjacent merged transistor and hot electrons at drain 12′ may be unintentionally injected into floating gate 13′ (note that the floating gate 13′ to drain 12′ voltage is too low for tunneling) and erase floating gate 13′. This possibility may be avoided by erasing in blocks of rows, i.e., page mode erasure.

Further understanding of the first preferred embodiment arises from consideration of a first preferred embodiment method of fabrication including the following steps illustrated in schematic cross sectional elevation views in FIGS. 3A–F:

(a) Grow pad oxide to a thickness of about 350 Å on p type <100> oriented silicon substrate 32; then spin on photoresist and pattern it to define buried bitlines 17. Implant a dose of $8 \times 10^{15}/cm^2$ of arsenic at 150 keV through the pad oxide using the patterned photoresist as the implant mask; see FIG. 3A. The projected range for this implant is about 800 Å, so the peak concentration is about 500 Å into the silicon.

(b) Strip the photoresist and the pad oxide. Grow self-aligned thick oxide 34 over the bitlines 17 at 900° C.; the heavily arsenic doped silicon (bitlines 17) oxidizes in steam at about eight times the rate of lightly doped p type silicon 32. Thus growing oxide 34 to a thickness of 4,000 Å only results in 500 Å of oxide 44 over the undoped silicon. Further, the implanted arsenic segregates into the silicon during oxidation, so the arsenic accumulates preferentially in fron of the advancing oxide/silicon interface. See FIG. 3B which also shows the effect of lateral diffusion of the arsenic (indicated by the arrows) which keeps bitlines 17 abutting oxide 44; the lateral diffusion will provide the source 11 and drain 12 regions for the cells 10.

(c) Etch oxides 34 and 44 to remove 500 Å plus a 20% overetch to compensate for nonuniformities. This removes all of oxide 44 and leaves oxide 34 of thickness about 3,400 Å. The etch may be a wet etch with HF or a plasma etch with $CF_4$. Next grow first gate oxide 40 to a thickness of 100 Å over silicon 32. The thickness of oxide 40 over source 11 and drain 12 will vary continuously from 100 Å at the boundary of source 11 and drain 12 with the remainder of substrate 32 to 800 Å at the interface with oxide 34; of course, this variance is due to the more rapid oxidation of arsenic doped silicon plus the further lateral diffusion of the arsenic. The growth will increase the thickness oxide 34 to about 4,000 Å; see FIG. 3C. Note that this step (c) could be avoided by growing the oxide in step (b) at a lower temperature (800° C.) to increase the preferential oxidation rate ratio to about eleven to one plus use a thicker first gate oxide, for example, 200 Å thick first gate oxide and 2,200 Å thick field oxide. Such a thicker first gate oxide would require higher voltages for the programming and erasure tunneling, and such a thinner field oxide would increase the capacitive coupling of the floating gate to the bitline.

(d) Deposit first level polysilicon to a thickness 3,000 Å by LPCVD, and implant or diffuse phosphorus to dope the polysilicon n+. Deposit or grow interlevel oxide to a thickness of 100 Å and deposit interlevel nitride to a thickness of 100 Å, each deposition is by LPCVD. Spin on photoresist and pattern it to define just the edges of floating gate 13 parallel to the bitlines 17; and use the patterned photoresist as etch mask to anisotropically etch the nitride, oxide, and polysilicon with a plasma of $CF_4$ to form the precursor of floating gate 13 with capping oxide 36 and nitride 38. See FIG. 3D for the cross sectional elevation view and FIG. 3E for the plan view; note that the plasma etch also removes a portion of the exposed part of first gate oxide 40. The remainder of the exposed portion of first gate oxide 40 is stripped with HF.

(e) Strip the patterned photoresist, and grow second gate oxide 42 to a thickness of 400 Å. This oxidation also grows oxide 50 to a thickness of 600 Å on the exposed ends of first polysilicon 13 but not elsewhere due to the masking by nitride 38. See FIG. 3F.

(f) Conformally deposit second polysilicon to a thickness of 3,000 Å by LPCVD. Dope the second polysilicon n+ by phosphorus implantation or diffusion. Spin on photoresist and pattern it to define wordlines 15 which include control gates 14, and use the patterned photoresist as etch mask to etch second polysilicon plus the nitride, oxide, and first polysilicon to form a stack with edges aligned to the edge of wordline 15. Note that the etch removes a portion of substrate 32 located between both the original edges of first polysilicon from step (d) and wordlines 15; see the cross sectional views FIGS. 2B-D. This completes the device as shown in FIGS. 2A-D. Note that the use of buried bitlines leads to an essentially planar device which simplifies the processing.

The first preferred embodiment EEPROM may be a CMOS device with the array of cells 10 in the p well or substrate and the peripheral devices such as the row decoder in CMOS; the foregoing description of cell 10 also applies to an NMOS device. Switching doping types and voltage polarities will yield PMOS devices and CMOS devices with the array of cells in the n well.

Figure 4:
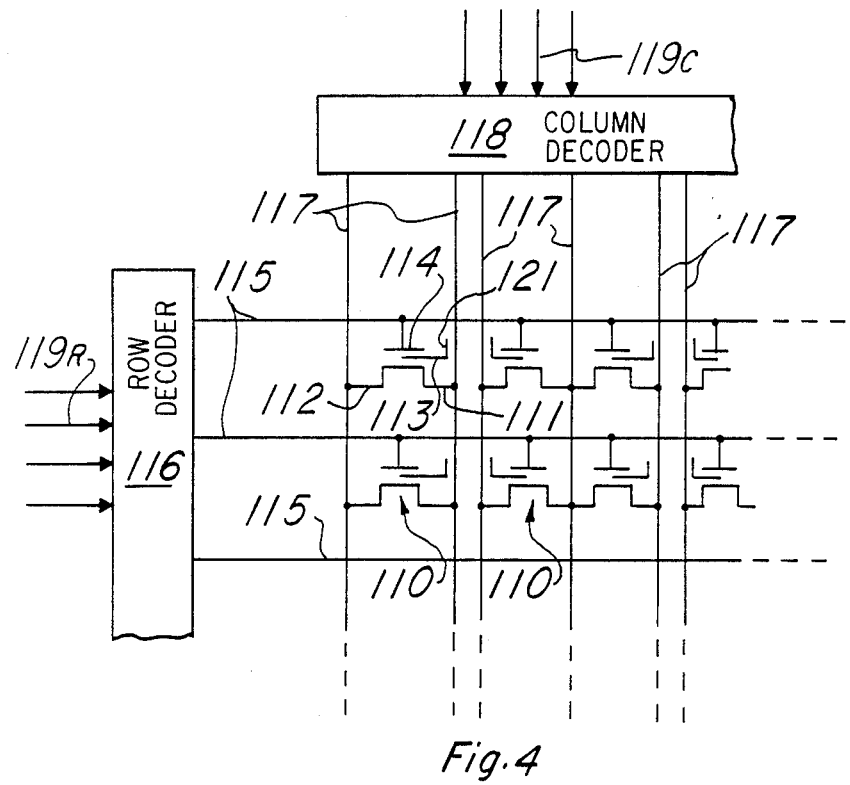
FIG. 4 is a plan view of a portion of a second preferred embodiment Flash EEPROM.

FIG. 4 is a schematic plan view of a second preferred embodiment Flash EEPROM illustrating a portion of the array of memory cells and peripheral devices; the full array may have over a million cells and be fabricated on a silicon substrate of size about 50 mm². Each cell is a floating gate transistor 110 having a source 111, a drain 112, a floating gate 113, a control gate 114, and an erase node 121. A bit of information is stored in cell 110 by net charge on floating gate 113: with no net charge on floating gate 113 the threshold voltage for cell 110 is low and with a substantial net negative charge on floating gate 113 the threshold voltage is high. The threshold voltage of cell 110 is determined to be high or low simply by applying a control gate 114 voltage and sensing the impedance.

All of the gates 114 in a row of cells are connected to a row address line (wordline)115, and all of the wordlines 115 are connected to a row decoder 116. All of the source and drain electrodes 111 or 112 in a column of cells are connected to a column line (bitline)117, and the source and drain bitlines 117 are connected to a column decoder 118. The operation of the second preferred embodiment will be considered in detail in connection with the description of the individual cells infra; however, the following cursory description of the operation provides a convenient overview. To read a selected cell, column decoder 118 applies about +3 volts to the bitline 117 connected to drain 112 of the selected cell and 0 volts to all other bitlines 117, and row decoder 116 applies about +5 volts to the wordline 115 connected to control gate 114 of the selected cell and about 0 volts to all other wordlines 115; thus all cells except the selected cell and the cell sharing the bitline as drain and the wordline are turned off regardless of any net charges on their floating gates and the selected cell is turned on or off depending upon the net charge on floating gate 113. Thus the impedance seen by column decoder 118 between the bitline 117 connected to the source of the selected cell and the bitline 117 connected to the drain of the selected cell indicates the bit of information stored by the selected cell. Signals on input lines 119C determine the bitline 117 selection and signals on input lines 119R determine the wordline 115 selection.

Figure 5A:
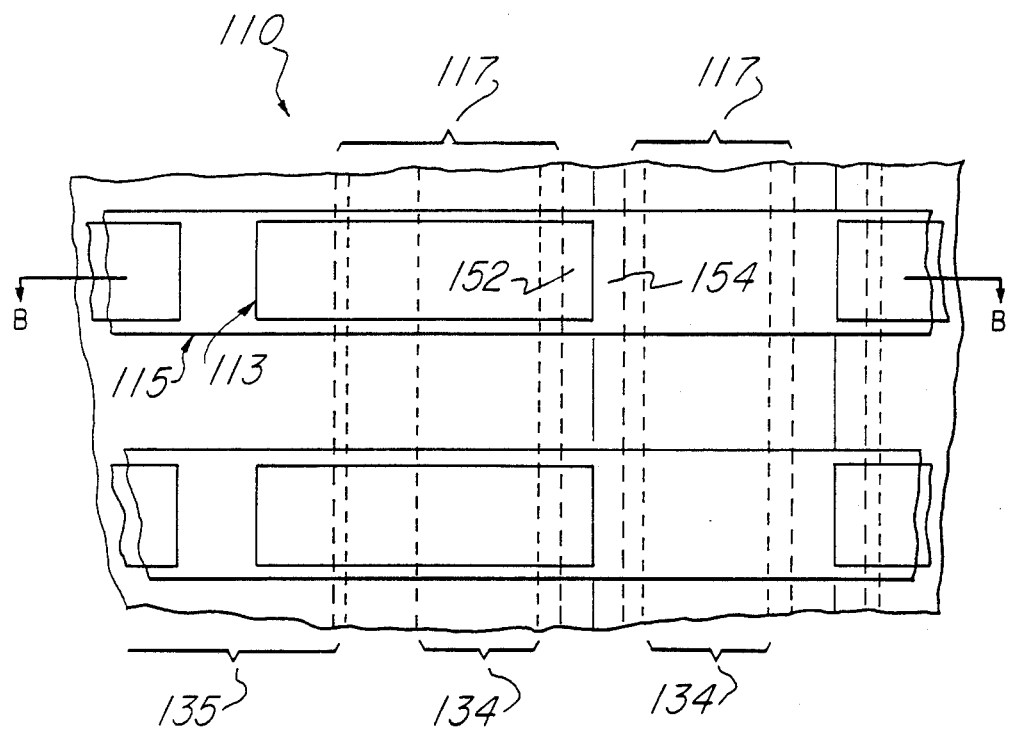
FIGS. 5A-B are plan and cross sectional elevation views of a second preferred embodiment cell.
Figure 5B:
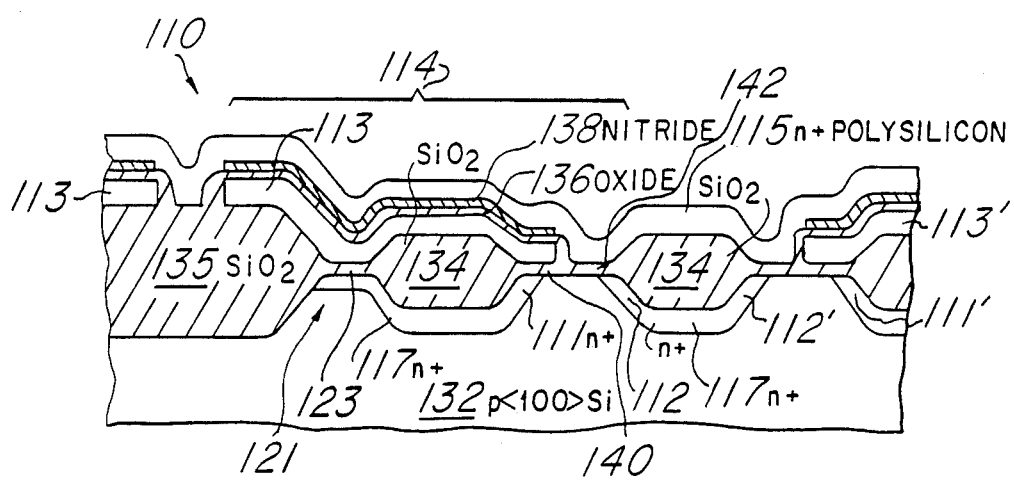

FIGS. 5A-B are schematic plan and cross sectional elevation views of an individual cell, generally denoted 110, in the second preferred embodiment; passivation, contacts, interconnections, metallizations, and packaging have been omitted for clarity. Cell 110 includes p type <100> oriented silicon substrate 132, buried n+ bitlines 117 which provide source 111 and drain 112, field oxide (silicon dioxide) 134, isolation field oxide 135, n+ doped polysilicon (polycrystalline silicon) floating gate 113, interlevel oxide 136, interlevel nitride (silicon nitride) 138, n+ doped polysilicon wordline 115 which provides control gate 114 as indicated in FIG. 5B, first gate oxide 140, second gate oxide 142, erase line 121, and erase tunneling oxide 123. As is apparent from FIG. 5A, cell 110 is a cross-point cell (the cell is at the cross-point of a bitline and a wordline although a field oxide isolation occurs every third bitline) and has the following dimensions expressed in terms of a scalable length $\lambda$: The channel region between source 111 and drain 112 has width $\lambda$ and lenth $\lambda$, buried bitlines have width $2\lambda$, floating gate 113 has width (vertical distance in FIG. 5A) $\lambda$ and is separated from the adjacent floating gate by $\lambda$, floating gate 113 has length $4\lambda$, the area 152 of the overlap of floating gate 113 on drain region 112 is about $\frac{1}{2}\lambda^2$, the area 154 of the overlap of floating gate 113 on the channel region is also about $\frac{1}{2}\lambda^2$, and the total area of floating gate 113 is about $4\lambda^2$. Thus cell 110 occupies about $12\lambda^2$. Typically, $\lambda$ would equal about 1 $\mu$m for a 1 Megabit Flash EEPROM, and the oxide and nitride thicknesses supra are convenient for such $\lambda$.

The operation of cell 110 is as follows with voltages given under the presumption of oxide and nitride thicknesses. The region between source 111 and drain 112 comprises a merged transistor with control 114 over floating gate 113 on first gate oxide 140 forming a floating gate transistor and with control gate 114 on second gate oxide 142 forming a select transistor in series with the floating gate transistor. The transistors have their threshold voltages adjusted to about 0.75 volts. Information in cell 110 is stored in terms of whether the merged transistor is turned on by a control gate voltage of 5 volts; the applied drain voltage is 3 volts. If floating gate 113 has a negative net charge sufficient to raise the threshold of the floating gate transistor to above 5 volts, then a control gate voltage of 5 volts is insufficient to turn on the merged transistor; whereas, if floating gate 113 has minimal net charge then a control gate voltage of 5 volts turns on both transistors. Contrarily, if the control gate voltage is about 0 volts, then the select transistor is off; this compensates for any over erasing of the floating gate transistor which could lower the threshold voltage to below 0 (depletion mode).

In the block erase mode, column decoder 118 applies a voltage of about 0 volts to all bitlines 117. To erase the row of cells or block of cells which includes cell 110, row decoder 116 applies a voltage pulse of about +13 volts to the wordline 115 connected to control gate 114 of the selected row and about 0 volts to all other wordlines 115. This causes tunneling of electrons from bitline 117 through tunneling oxide 123 into floating gate 113 for each cell in the row and results in a block erase. Of course, all rows can be simultaneously erased by applying the voltage pulse to all wordlines and this yields a bulk erase.

In the program mode, column decoder 118 applies a voltage of about +5 volts to the bitline 117 connected to the drain of the selected cell and about 0 volts to all other bitlines 117. To perform the programming, row decoder 116 applies a voltage pulse of about −8 volts to the wordline 115 connected to the control gate 114 of the selected cell and about 0 volts to all other wordlines 115. Electrons tunnel out of floating gate 113 through tunneling oxide 123 into source 111 for the selected cell.

Alternatively, hot electrons may be injected into floating gate 113 for programming and tunneling used to remove them for erasure. In this case, a net negative charge on floating gate 113 and the consequent high threshold voltage corresponds to the programmed state, and minimal net charge on floating gate 113 and the consequent low threshold voltage corresponds to the erased state. Thus cell 110 is erased (reduce net charge on floating gate 113 to minimal levels) together with all other cells in the array by tunneling electrons from floating gate 113 to the bitline 117 containing source 111 under the conditions of 0 volts on all wordlines 115, +15 volts on all bitlines 117 which include sources 111, and floating (disconnecting) bitlines connected to drains 112. The tunneling is driven by the initial potential drop of about +10 volts across the thin tunneling oxide 123.

Cell 110 is programmed (put negative net charge on floating gate 13) by avalanche injecting electrons from source 111 into floating gate 113 under the conditions of +13 volts on wordline 115 which includes control gate 114, 0 volts on all other wordlines, +10 volts on bitline 117 which includes source 111, and 0 volts on all other bitlines. Other cells in the same row are not programmed because the 0 volts on all other bitlines implies no current flowing and no hot electrons; and all other cells in different rows are not programmed because the control gate voltage is 0 volts.

Cell 110 may be fabricated by the first preferred embodiment method with the additional steps of (1) growing isolation oxide 135 prior to the implantation and oxide 134 growth of the analogues of steps (a) and (b) and (2) implanting further arsenic to extend the bitline 117 under tunneling oxide 123, either before the growth of first gate oxide 140 and tunneling oxide 123 or through tunneling oxide 123. Note that this further arsenic implant may be avoided with the tradeoff being a smaller area for erasure tunneling and thus longer erasure times.

Figure 6:
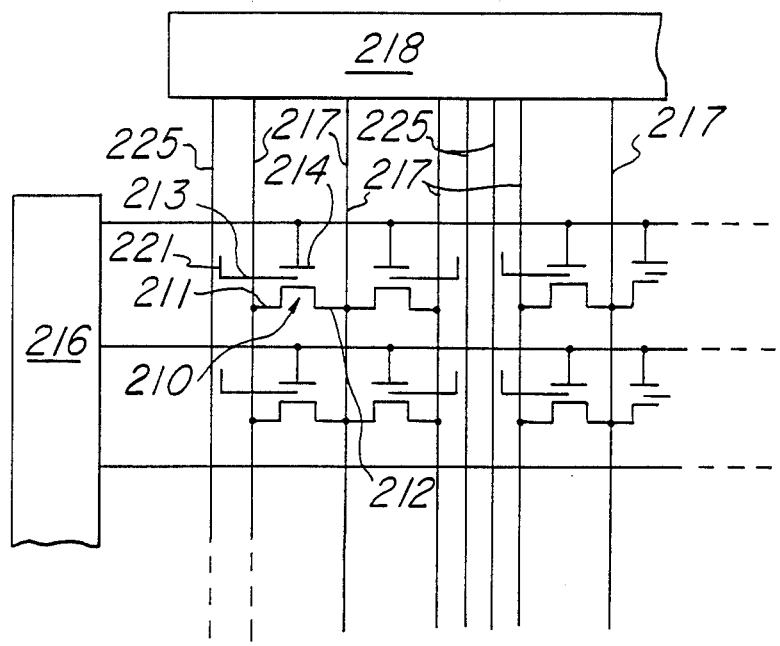
FIG. 6 is a plan view of a portion of a third preferred embodiment Flash EEPROM.

A third preferred embodiment of a Flash EEPROM is partially shown in schematic plan view in FIG. 6 and includes an array of memory cells and peripheral devices. Each cell is a floating gate transistor 210 having a source 211, a drain 212, a floating gate 213, a control gate 214, and an erase node 221; that is, the same elements as a cell 110. But cell 210 has the erase node 221 on a separate diffusion line 225 and remote from the source bitline 217. All of the gates 214 in a row of cells are connected to a wordline 215, and all of the wordlines 215 are connected to a row decoder 216. All of the sources 211 in a column of cells are in a source bitline 217, all of the drains 212 in a column of cells are in a drain bitline 217, and the source and drain bitlines 217 are connected to a column decoder 218. The erase nodes 221 are all connected to erase lines 225. The operation of the third preferred embodiment is similar to that of the second preferred embodiment and will be considered in detail in connection with the description of the individual cells infra.

Figure 7A:
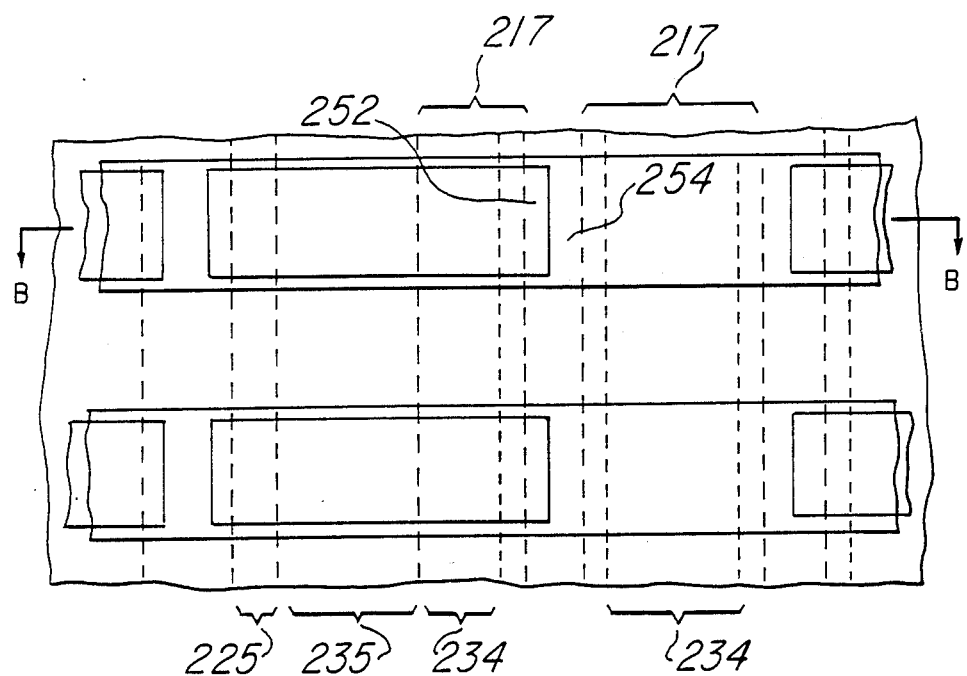
FIGS. 7A-B are plan and cross sectional elevation views of a third preferred embodiment cell.
Figure 7B:
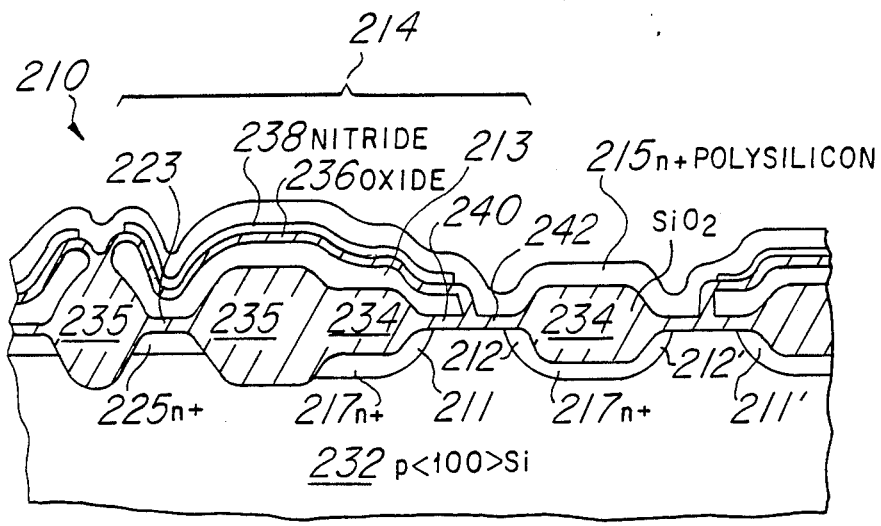

FIGS. 7A-B are schematic plan and cross sectional elevation views of an individual cell, generally denoted 210, in the third preferred embodiment; passivation, contacts, interconnections, metallization, and packaging have been omitted for clarity. Cell 210 includes p type <100> oriented silicon substrate 232, buried n+ bitlines 217 which provide source 211 and drain 212, field oxide 235, isolation field oxide 235, n+ doped polysilicon floating gate 213, interlevel oxide 236, interlevel nitride 238, n+ doped polysilicon wordline 215 which provides control gate 214 as indicated in FIG. 7B, first gate oxide 240, second gate oxide 242, erase tunneling oxide 223, and buried n+ erase line 225. As is apparent from FIG. 7A, cell 210 is approximately a cross-point cell (the cell is at the cross-point of a bitline/erase line pair and a wordline) and has the following dimensions expressed in terms of a scalable length $\lambda$: The channel region between source 211 and drain 212 has width $\lambda$ and length $\frac{3}{2}\lambda$, buried source bitlines 217 have width $\lambda$, buried drain bitlines 217 have width $2\lambda$, floating gate 213 has width (vertical distance in FIG. 7A) $\lambda$ and is separated from the adjacent floating gate by $\lambda$, floating gate 213 has length $4\lambda$, the area 252 of the overlap of floating gate 213 on drain region 212 is about $\frac{1}{2}\lambda^2$, the area 254 of the overlap of floating gate 213 on the channel region is also about $\frac{1}{2}\lambda^2$, and the total area of floating gate 213 is about $4\lambda^2$. Thus cell 210 occupies about $12\lambda^2$. Typically, $\lambda$ would equal about 1 μm for a 1 Megabit Flash EEPROM, and the oxide and nitride thicknesses supra are convenient for such $\lambda$.

The operation of cell 210 is similar to that of cell 110 but whith the separate erase line 225 providing additional floating gate 213 potential control which will be apparent infra. As with cells 10 and 110, the region between source 211 and drain 212 comprises a merged transistor with control gate 214 over floating gate 213 on first gate oxide 240 forming a floating gate transistor and with control gate 214 on second gate oxide 242 forming a selectet transistor in series with the floating gate transistor. The transistors have their threshold voltages adjusted to about 0.75 volts. Information in cell 210 is stored in terms of whether the merged transistor is turned on by a control gate voltage of 5 volts; the applied drain voltage is 3 volts. If floating gate 213 has a negative net charge sufficient to raise the threshold of the floating gate transistor to above 5 volts, then a control gate voltage of 5 volts is insufficient to turn on the merged transistor; whereas, if floating gate 213 has minimal net charge then a control gate voltage of 5 volts turns on both transistors. Contrarily, if the control gate voltage is about 0 volts, then the select transistor is off; this compensates for any over erasing of the floating gate transistor which could lower the threshold voltage to below 0 (depletion mode). During this read of cell 210, erase line 225 is held at 5 volts to raise the potential of floating gate 213.

In the block erase mode, column decoder 218 applies a voltage of about 0 volts to all bitlines 217. To erase the row of cells or block of cells which includes cell 210, row decoder 216 applies a voltage pulse of about +13 volts to the wordline 215 connected to control gate 214 of the selected row and about 0 volts to all other wordlines 215. This causes tunneling of electrons from bitline 217 through tunneling oxide 123 into floating gate 213 for each cell in the row and results in a block erase. Of course, all rows can be simultaneously erased by applying the voltage pulse to all wordlines and this yields a bulk erase.

In the program mode, column decoder 218 applies a voltage of about +5 volts to the bitline 217 connected to the source of the selected cell and about 0 volts to all other bitlines 217. To perform the programming, row decoder 216 applies a voltage pulse of about −8 volts to the wordline 215 connected to the control gate 214 of the selected cell and about 0 volts to all other wordlines 215. Electrons tunnel out of floating gate 213 through tunneling oxide 223 into source 211 for the selected cell.

Alternatively, hot electrons may be injected into floating gate 213 for programming and tunneling used to remove them for erasure. In this case a net negative charge on floating gate 213 and the consequent high threshold voltage corresponds to the programmed state, and minimal net charge on floating gate 213 and the consequent low threshold voltage corresponds to the erased state. Thus cell 210 is programmed (put negative net charge on floating gate 213) by avalanche injecting electrons from source 211 into floating gate 213 under the conditions of +13 volts on wordline 215 which includes control gate 214, 0 volts on all other wordlines, +10 volts on bitline 217 which includes source 211, 1 volt on all other bitlines (which includes the bitline with drain 212), and 5 volts on erase line 225. The 5 volt bias on erase line 225 raises the potential of floating gate 213 and improves charge collection. Other cells in the same row are not programmed because the 1 volt on all other bitlines implies no hot electrons; and all other cells in different rows are not programmed because the control gate voltage is 0 volts.

Cell 210 is erased (reduce net charge on floating gate 213 to minimal levels) together with all other cells in the array by tunneling electrons from floating gate 213 into the erase lines 225 under the conditions of 0 volts on all wordlines 115, +15 volts on all erase lines 225, and floating (disconnecting) all bitlines 217. The tunneling is driven by the initial potential drop of about +10 volts across the thin tunneling oxide 223.

Various modifications of the preferred embodiment devices and methods may be made while retaining the features of buried source and drain lines and remote substrate erase lines which provide a planar topography and limited use of metal lines, large floating gate capacitive coupling to the control gate for low voltage operation, and crosspoint layout for high packing density with a merged transistor and electrical programming and erasure from polysilicon floating gate to an underlying diffusion line. For example, the dimensions and shapes of the cells could be varied such as having the buried lines and/or the wordlines bulging or sinuous rather than uniform and straight, having the wordlines silicided, using other semiconductor materials or silicon-on-insulator type substrates, and using other insulator materials.

The invention provides the advantages of high packing density and simple fabrication processing.

What is claimed is:

1. A memory device, comprising:
   (a) a semiconductor layer of first conductivity type having a surface;
   (b) a plurality of parallel first buried lines of a second conductivity type in said layer, each of said buried lines beneath a corresponding insulating line beneath said surface of said layer;
   (c) a plurality of parallel conducting lines over both said surface and said insulating lines, said parallel conducting lines crossing over said buried lines;
   (d) a plurality of parallel erase lines of said second conductivity type in said layer beneath said surface, said erase lines parallel to said buried lines; and
   (e) a plurality of isolated gates, each of said gates: (i) made of a conductive material, (ii) located beneath one of said parallel conducting lines, (iii) overlying one of said insulating lines and extending on both sides of said one insulating line, (iv) with a first end terminating over a portion of said surface between a pair of adjacent ones of said insulating lines with the corresponding pair of adjacent ones of said buried lines extending up to said portion of said surface, wherein said pair of adjacent ones of said buried lines form the source and drain of a merged floating gate tansistor with said gate forming the floating gate of the transistor and with said one of said conducting lines forming the control gate of the transistor, and (v) a second end remote from said first end and separated from one of said erase lines by a tunnelable insulator.

2. The memory of claim 1, wherein:
each of said erase lines is separated from an adjacent one of said buried lines by second insulating lines.

3. The memory of claim 1, wherein:
   (a) said semiconductor layer is p type silicon;
   (b) said insulating lines are silicon dioxide;
   (c) said buried lines are n type silicon;
   (d) said conducting lines are polysilicon;
   (e) said isolated gates are polysilicon; and
   (f) said tunnelable insulator is silicon dioxide.

4. The memory of claim 3, wherein:
said buried lines and corresponding insulating lines are silicon dioxide overlying n type doped lines.

5. The memory of claim 3, wherein:
   (a) each of said buried lines is of uniform width;
   (b) each of said insulating lines is of uniform width;
   (c) each of said coducting lines is of uniform width; and
   (d) said buried lines are perpendicular to said conducting lines.

* * * * *